US008890529B2

(12) United States Patent
Jiang et al.

(10) Patent No.: US 8,890,529 B2
(45) Date of Patent: Nov. 18, 2014

(54) SYSTEM AND APPARATUS FOR PROVIDING INTERCONNECTIONS IN A GRADIENT COIL ASSEMBLY

(75) Inventors: Longzhi Jiang, Florence, SC (US);
Timothy J. Havens, Florence, SC (US);
John Scaturro, Jr., Florence, SC (US);
William L. Einziger, Florence, SC (US);
Tesfaye K. Kidane, Florence, SC (US)

(73) Assignee: General Electric Company, Schenectady, NY (US)

( * ) Notice: Subject to any disclaimer, the term of this patent is extended or adjusted under 35 U.S.C. 154(b) by 731 days.

(21) Appl. No.: 13/157,596

(22) Filed: Jun. 10, 2011

(65) Prior Publication Data

US 2012/0306495 A1    Dec. 6, 2012

Related U.S. Application Data

(60) Provisional application No. 61/491,658, filed on May 31, 2011.

(51) Int. Cl.
*G01R 33/385*    (2006.01)
*G01R 33/421*    (2006.01)

(52) U.S. Cl.
CPC .......... *G01R 33/385* (2013.01); *G01R 33/3858* (2013.01); *G01R 33/4215* (2013.01)
USPC .......................................... 324/318; 324/322

(58) Field of Classification Search
USPC .......................... 324/300–322; 600/407–435; 382/128–131
See application file for complete search history.

(56) References Cited

U.S. PATENT DOCUMENTS

| 4,794,338 | A | | 12/1988 | Roemer et al. | |
|---|---|---|---|---|---|
| 5,084,676 | A | * | 1/1992 | Saho et al. | 324/318 |
| 5,457,387 | A | * | 10/1995 | Patrick et al. | 324/318 |
| 5,530,355 | A | * | 6/1996 | Doty | 324/318 |
| 5,592,087 | A | * | 1/1997 | Richard et al. | 324/318 |
| 5,990,681 | A | * | 11/1999 | Richard et al. | 324/318 |
| 6,060,882 | A | * | 5/2000 | Doty | 324/318 |
| 6,144,204 | A | | 11/2000 | Sementchenko | |
| 6,437,567 | B1 | * | 8/2002 | Schenck et al. | 324/318 |
| 6,933,722 | B2 | * | 8/2005 | Tsuda et al. | 324/318 |
| 6,954,068 | B1 | * | 10/2005 | Takamori et al. | 324/318 |
| 6,998,842 | B2 | * | 2/2006 | Sinnema et al. | 324/318 |
| 7,030,610 | B2 | * | 4/2006 | Mansfield | 324/318 |
| 7,068,033 | B2 | * | 6/2006 | Sellers et al. | 324/318 |
| 7,292,036 | B2 | * | 11/2007 | Ham et al. | 324/318 |
| 7,370,789 | B2 | * | 5/2008 | Ham | 324/318 |

(Continued)

OTHER PUBLICATIONS

Search Report from corresponding GB Application No. 1209460.3 Aug. 31, 2012.

*Primary Examiner* — Melissa Koval
*Assistant Examiner* — Tiffany Fetzner

(57) ABSTRACT

A gradient coil apparatus for a magnetic resonance imaging (MRI) system includes an inner gradient coil assembly comprising at least one inner gradient coil and an outer gradient coil assembly comprising at least one outer gradient coil. At least one gradient coil interconnect is coupled to the inner gradient coil and the outer gradient coil. The gradient coil interconnect includes a wire assembly comprising a plurality of conductors. The wire assembly has a first end electrically coupled to the outer gradient coil assembly and a second end electrically coupled to the inner gradient coil. The gradient coil interconnect also includes a reinforcement material disposed around a portion of the wire assembly.

17 Claims, 5 Drawing Sheets

(56) References Cited

U.S. PATENT DOCUMENTS

| | | | |
|---|---|---|---|
| 7,372,275 B2* | 5/2008 | Feenan | 324/322 |
| 7,397,244 B2* | 7/2008 | Cirel | 324/318 |
| 7,518,372 B2* | 4/2009 | Schilling et al. | 324/322 |
| 7,554,326 B2* | 6/2009 | Sakakura | 324/318 |
| 8,179,137 B2* | 5/2012 | Feng et al. | 324/322 |
| 8,188,740 B2* | 5/2012 | Ninomiya et al. | 324/318 |
| 8,575,934 B2* | 11/2013 | Iwasa et al. | 324/318 |
| 2004/0251901 A1* | 12/2004 | Tsuda et al. | 324/318 |
| 2005/0248350 A1* | 11/2005 | Tsuda et al. | 324/322 |
| 2007/0085542 A1* | 4/2007 | Ham et al. | 324/318 |
| 2011/0031970 A1* | 2/2011 | Ninomiya et al. | 324/318 |
| 2012/0306495 A1* | 12/2012 | Jiang et al. | 324/318 |

* cited by examiner

SYSTEM AND APPARATUS FOR PROVIDING INTERCONNECTIONS IN A GRADIENT COIL ASSEMBLY

CROSS REFERENCE TO RELATED APPLICATION

The present application claims the benefit of U.S. Provisional Application Ser. No. 61/491,658, filed May 31, 2011, herein incorporated by reference in its entirety.

FIELD OF THE INVENTION

The present invention relates generally to a magnetic resonance imaging (MRI) system and in particular to a system and apparatus for providing interconnections between inner and outer gradient coils in a shielded gradient coil assembly.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

The gradient coil assembly used in an MRI system may be a shielded gradient coil assembly that consists of inner and outer gradient coil assemblies bonded together with a material such as epoxy resin. Typically, the inner gradient coil assembly incudes inner (or main) coils of X-, Y-, and Z-gradient coil pairs or sets and the outer gradient coil assembly includes the respective outer (or shielding) coils of the X-, Y- and Z-gradient coil pairs or sets. The Z-gradient coils are typically cylindrical with a conductor spirally would around the cylindrical surface. The transverse X- and Y- gradient coils are commonly formed from a copper panel with an insulating backing layer. A conductor turn pattern (e.g., a fingerprint pattern) may be cut in the copper layer of the gradient coil.

The respective inner and outer gradient coils are coupled together using an interconnect or connector to provide electrical and signal connections. Typically, a gradient coil interconnect is formed from a solid, rigid conducting material such as copper in the form of a plate. During operation of the gradient coil assembly, the inner and outer gradient coils are subjected to opposing electromagnetic forces that cause mechanical stress on the inner and outer gradient coil assemblies as well as the interconnections between the inner and outer gradient coils. The forces and stress during operation of the gradient coil assembly can cause the solid, rigid interconnections to break.

It would be desirable to provide interconnections capable of withstanding the forces and stress occurring during operation of the gradient coil assembly for improved performance and increased reliability.

BRIEF DESCRIPTION OF THE INVENTION

In accordance with an embodiment, a gradient coil apparatus for a magnetic resonance imaging (MRI) system, the gradient coil apparatus includes an inner gradient coil assembly comprising at least one inner gradient coil, an outer gradient coil assembly comprising at least one outer gradient coil and at least one gradient coil interconnect coupled to the inner gradient coil and the outer gradient coil, the gradient coil interconnect including a wire assembly comprising a plurality of conductors and having a first end electrically coupled to the outer gradient coil assembly and a second end electrically coupled to the inner gradient coil and a reinforcement material disposed around a portion of the wire assembly.

In accordance with another embodiment, a gradient coil interconnect for providing electrical connections between gradient coils in a magnetic resonance imaging (MRI) system, the gradient coil interconnect includes a wire assembly comprising a plurality of conductors and electrically coupled between the gradient coils and a reinforcement material disposed around a portion of the wire assembly.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
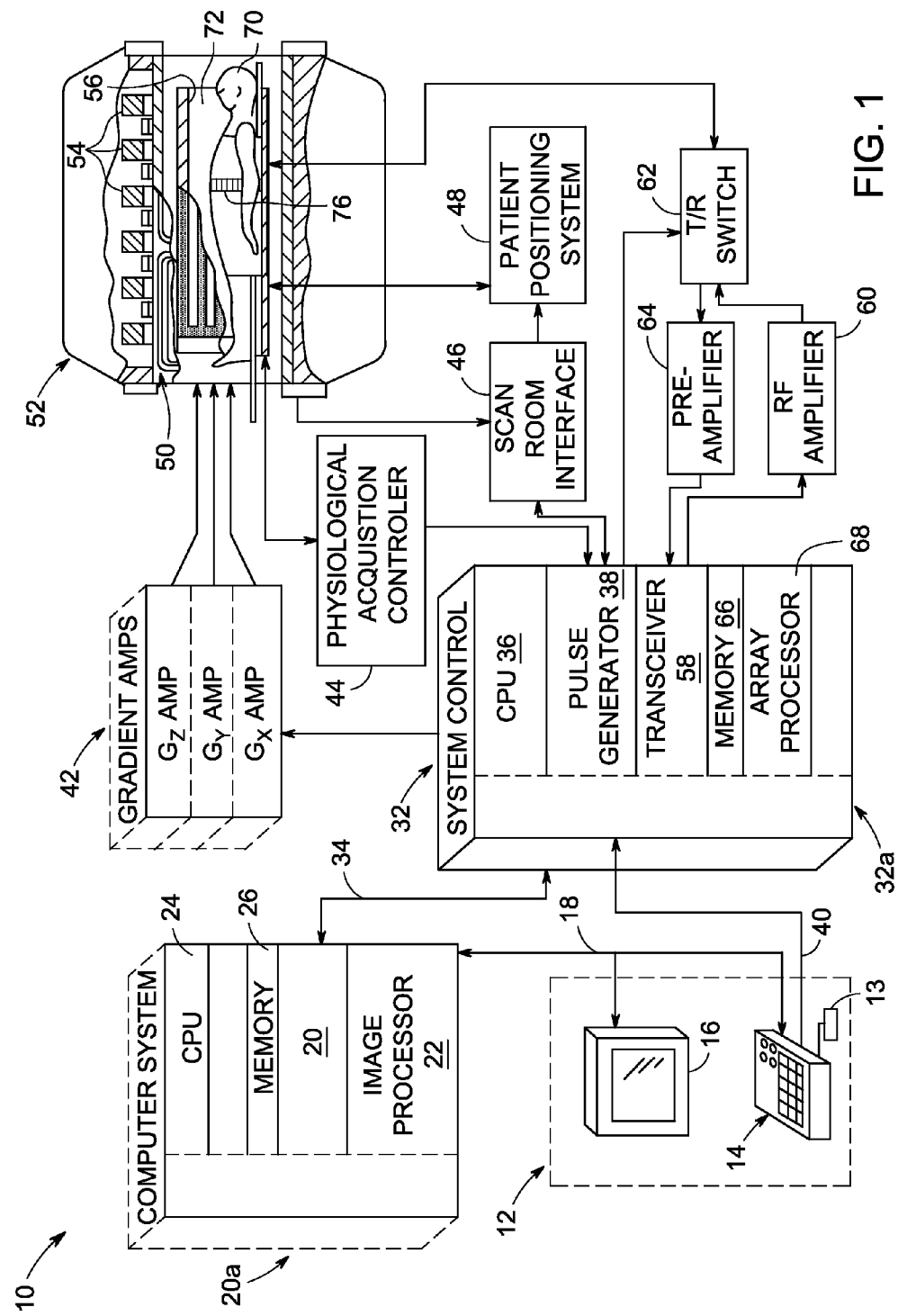
FIG. 1 is a schematic block diagram of an exemplary magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$ and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 or parallel or surface coil 76 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

Figure 2:
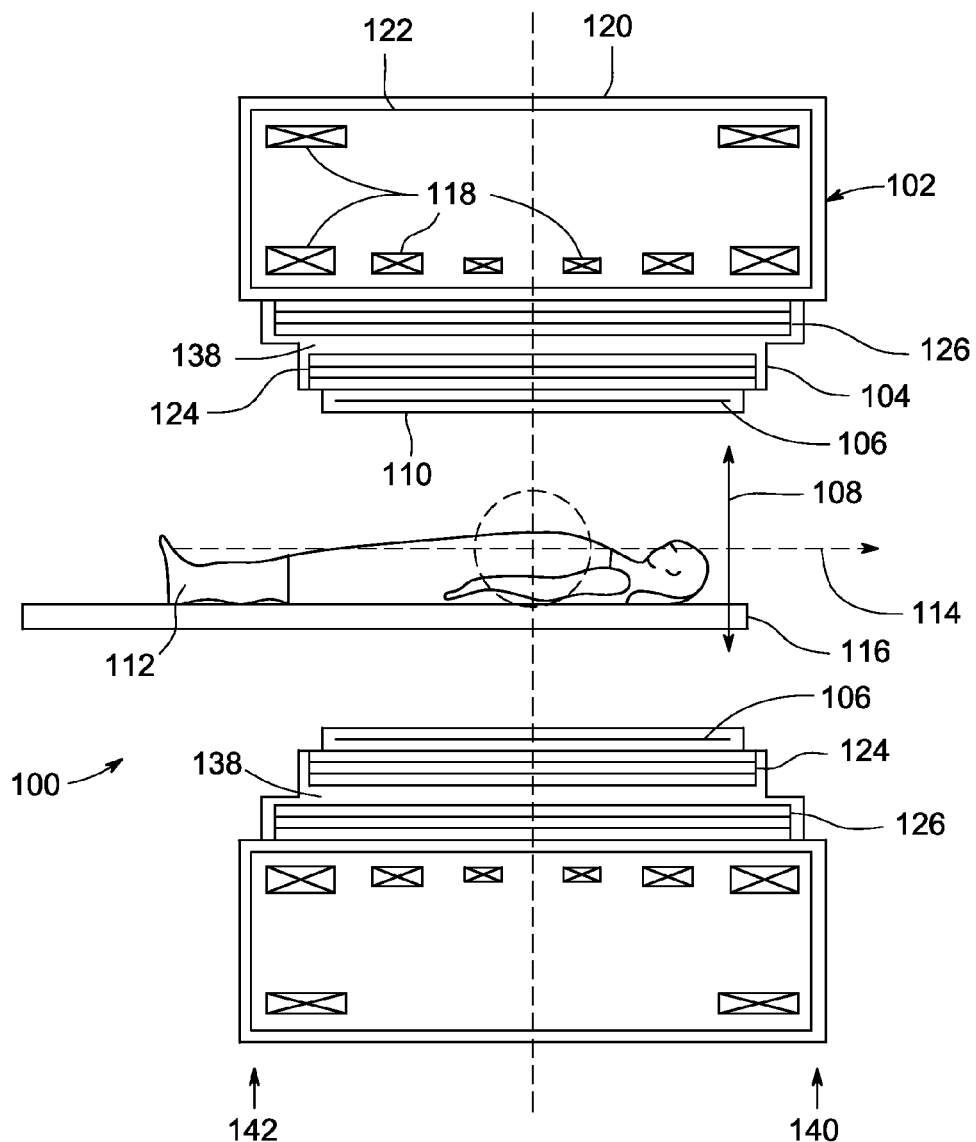
FIG. 2 is a schematic side elevation view of a magnet assembly in accordance with an embodiment.

FIG. 2 is a schematic side elevation view of a resonance assembly in accordance with an embodiment. Resonance assembly 100 may be used in an MRI system such as MRI system 10 shown in FIG. 1. The resonance assembly 100 is cylindrical in shape and includes, among other elements, a superconducting magnet 102, a gradient coil assembly 104 and a RF coil 106. Various other elements such as covers, supports, suspension members, end caps, brackets, etc. are omitted from FIG. 2 for clarity. A cylindrical patient volume or bore 108 is surrounded by a patient bore tube 110. RF coil 106 is cylindrical and is disposed around an outer surface of the patient bore tube 110 and mounted inside the cylindrical gradient coil assembly 104. The gradient coil assembly 104 is disposed around the RF coil 106 is a spaced-apart coaxial relationship and the gradient coil assembly 104 circumferentially surrounds the RF coil 106. Gradient coil assembly 104 is mounted inside magnet 102 and is circumferentially surrounded by magnet 102.

A patient or imaging subject 112 may be inserted into the resonance assembly 100 along a center axis 114 (e.g., a Z-axis) on a patient table or cradle 116. The patient table or cradle 116 is inserted into the resonance assembly at a "patient end" 142 of the resonance assembly and the opposing end of the cylindrical resonance assembly is a "service end" 140. Center axis 114 is aligned along the tube axis of the resonance assembly 100 parallel to the direction of a main magnetic field, B0, generated by the magnet 102. RF coil 106 may be used to apply a radio frequency pulse (or plurality of pulses) to a patient or subject 112 and may be used to receive MR information back from the subject 112 as is well known in the field of MR imaging. Gradient coil assembly 104 generates time dependent gradient magnetic pulses that are used to spatially encode points in the imaging volume in a known manner.

Superconducting magnet 102 may include, for example, several radially aligned and longitudinally spaced apart superconductive coils 118, each capable of carrying a large current. The superconductive coils 118 are designed to create a magnetic field, B0, within the patient volume 108. The superconductive coils 118 are enclosed in a cryogen environment within a cryogenic envelope 122. The cryogenic environment is designed to maintain the temperature of the superconducting coils 118 below the appropriate critical temperature so that the superconducting coils 118 are in a superconducting state with zero resistance. Cryogenic envelope 122 may include, for example, a helium vessel (not shown) and thermal or cold shields (not shown) for containing and cooling magnet windings in a known manner. Superconducting magnet 102 is enclosed by a magnet vessel 120, e.g., a cryostat vessel. Magnet vessel 120 is configured to maintain a vacuum and to prevent heat from being transferred to the cryogenic envelope 122.

Gradient coil assembly 104 is a self-shielded gradient coil assembly. Gradient coil assembly 104 comprises a cylindrical inner gradient coil assembly or winding 124 and a cylindrical outer gradient coil assembly or winding 126 disposed in a concentric arrangement with respect to a common axis 114. Inner gradient coil assembly 124 includes inner (or main) X-, Y- and Z- gradient coils and outer gradient coil assembly 126 includes the respective outer (or shielding) X-, Y-, and Z-gradient coils. The coils of the gradient coil assembly 104 may be activated by passing an electric current through the coils to generate a gradient field in the patient volume 108 as required in MR imaging. A volume 138 or space between inner gradient coil assembly 124 and outer gradient coil assembly 126 may be filled with a bonding material, e.g., epoxy resin, visco-elastic resin, polyurethane, etc. Alternatively, an epoxy resin with filler material such as glass beads, silica and alumina may be used as the bonding material. It should be understood that magnet and gradient topologies other than the cylindrical assemblies described above with respect to FIGS. 1 and 2 may be used. For example, a flat gradient geometry in a split-open MRI system may also utilize embodiments of the invention as described below.

Figure 3:
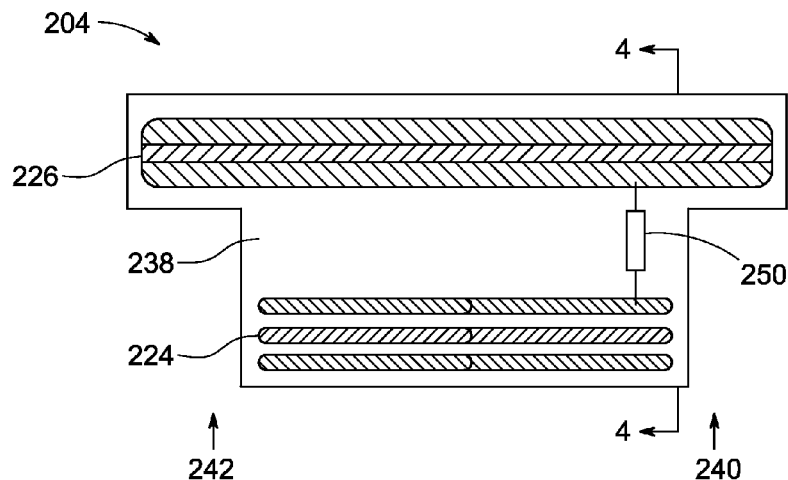
FIG. 3 is a schematic cross-sectional view of a shielded gradient coil assembly in accordance with an embodiment.

The X-, Y- and Z-gradient coils in the inner gradient coil assembly 124 are coupled to the corresponding X-, Y, or Z-gradient coil in the outer gradient coil assembly 126 using interconnections as shown in FIG. 3. FIG. 3 is a schematic cross-sectional view of a shielded gradient coil assembly in accordance with an embodiment. Various elements such as covers supports, suspension members, end caps, brackets, etc. are omitted from FIG. 3 for clarity. Gradient coil assembly 204 may be inserted into a resonance assembly of an MRI system such as resonance assembly 100 shown in FIG. 2. An outer gradient coil assembly 226 and an inner gradient coil assembly 224 are bonded together using a bonding material (for example, epoxy resin, visco-elastic resin, polyurethane, etc.) in volume 238. A gradient coil interconnect or connector 250 is used to couple a coil in the inner gradient coil assembly 224 to a corresponding coil in the outer gradient coil assembly 226.

Figure 4:
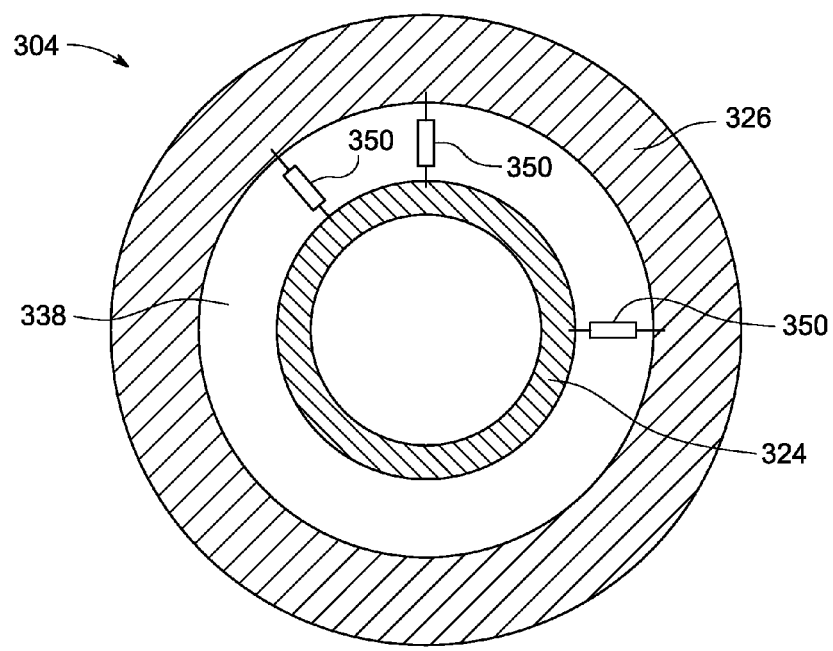
FIG. 4 is a schematic diagram of a cross-sectional view of the gradient coil assembly of FIG. 3 taken along line 4-4 of FIG. 3 in accordance with an embodiment.

Interconnect 250 is used to allow for electrical and signal connectivity between the inner and outer gradient coils. An interconnect 250 may be used to connect the inner X-gradient coil to the outer X-gradient coil. An interconnect 250 may be used to connect the inner Y-gradient coil to the outer Y-gradient coil. An interconnect 250 may be used to connect the inner Z-gradient coil to the outer Z-gradient coil. The gradient coil interconnect(s) may be positioned at a service end 240 of the gradient coil assembly 204 shown in FIG. 3. In alternative embodiments, the gradient coil interconnect(s) 250 may be positioned at a patient end 242 or at both the service end 240 and patient end 242. In an embodiment, the gradient coil interconnect(s) 250 may be positioned at different locations around an end of the cylindrical gradient coil assembly as shown in FIG. 4. FIG. 4 is a schematic diagram of a cross-sectional view of the gradient coil assembly of FIG. 3 taken along line 4-4 of FIG. 3 in accordance with an embodiment. In the embodiment shown in FIG. 4, three gradient coil interconnects 350 are positioned at various locations around the circumference of the end of the gradient coil assembly. Each gradient coil interconnect 350 couples a coil in the inner gradient coil assembly 324 to a corresponding coil in the outer gradient coil assembly 326. As described above, the inner gradient coil assembly 324 and the outer gradient coil assembly 326 are bonded together with a bonding material in volume 338.

Figure 5:
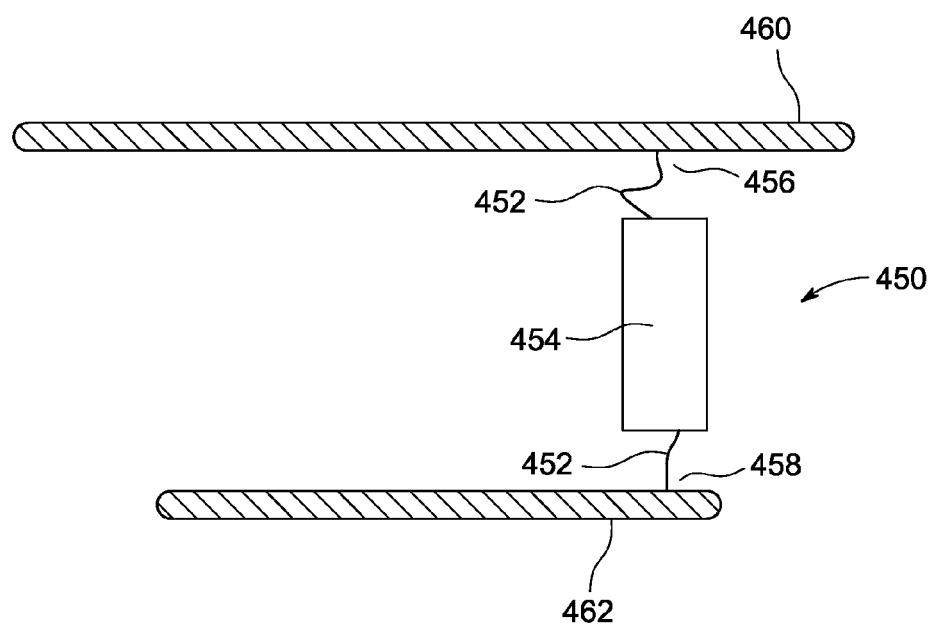
FIG. 5 is a schematic cross-sectional view of a gradient coil apparatus with a gradient coil interconnect in accordance with an embodiment.

Returning to FIG. 3, gradient coil interconnect 250 includes a wire assembly and a reinforcing material as shown in more detail in FIG. 5. FIG. 5 is a schematic cross-sectional view of a gradient coil apparatus with a gradient coil interconnect in accordance with an embodiment. A gradient coil interconnect 450 couples or connects an inner gradient coil 462 and an outer gradient coil 460. The gradient coil interconnect 450 includes a wire assembly 452 that has a first end 456 and a second end 458. The first end 456 of the wire assembly 452 is coupled to the outer gradient coil 460 and the second end 458 of the wire assembly 452 is coupled to the inner gradient coil 462. The first end 456 and the second end 458 of the wire assembly 452 may be connected to the outer gradient coil 260 and the inner gradient coil 462, respectively, using various methods, for example, soldering or a mechanical fastening such as crimping. A portion of the wire assembly 452 is surrounded by a reinforcement material 454 that is configured to provide stiffness and insulation. The reinforcement material is preferably a non-metal material with rigid properties. The reinforcement material 454 may be sized and shaped as desired or needed, such as to have different shaped cross-sections, for example, based on the connection requirements. The portions of the wire assembly 452 not surrounded by the reinforcement material 454 (e.g., first end 456 and second end 458) provide flexibility for strain or stress relief.

Figure 6:
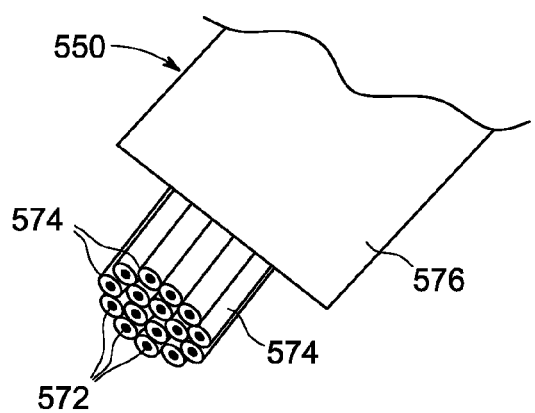
FIG. 6 is a top perspective view of an exemplary gradient coil interconnect in accordance with an embodiment.

Wire assembly 452 includes a plurality of wires. FIG. 6 is a top perspective view of an exemplary gradient coil interconnect in accordance with an embodiment. Gradient coil interconnect 550 may be used in a gradient coil assembly such as is described above with respect to FIGS. 2-5. Gradient coil interconnect 550 includes a plurality of individual wire conductors 572, each having circular cross-section and each having substantially the same length. Different numbers of wires may be used based on the requirements of the connection. Each wire conductor 572 is individually insulated with an electrical insulation material 574 disposed around and surrounding an outer surface of the wire conductor 572. The wire conductors 572 are formed from a high electrical conductivity material such as copper or silver, for example. Moreover, the insulation material 574 is selected to withstand high breakdown voltage. In this embodiment, the wire conductors 572 are configured in a parallel arrangement such that the conductors 572 run parallel to each other along the length of the gradient coil interconnect 550. Gradient coil interconnect 550 also includes a reinforcement material 576 that is configured to encase the plurality of insulated wire conductors 572 to maintain the wire conductors 572 in a relatively fixed position with respect to each other. The reinforcement material 576 is preferably a non-metal material with rigid properties and may be sized and shaped as desired or needed, such as to have different shaped cross-sections, for example, based on the connection requirements.

Figure 7:
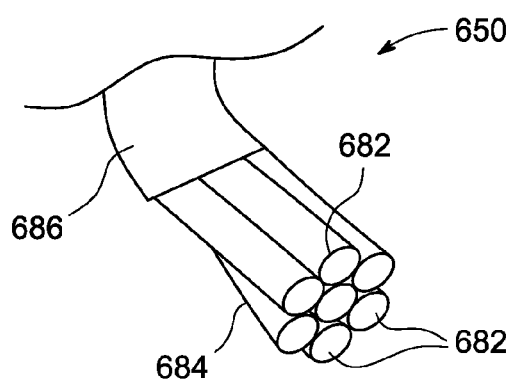
FIG. 7 is a top perspective view of another exemplary gradient coil interconnect in accordance with an embodiment.

FIG. 7 is a top perspective; of another exemplary gradient coil interconnect, in accordance with an embodiment. Gradient coil interconnect 650 may be used in a gradient coil assembly such as is described above with respect to FIGS. 2-5. Gradient coil interconnect 650 includes a plurality of individual wire conductors 682 each having circular cross-section and each having substantially the same length. Different numbers of wires may be used based on the requirements of the connection. Each wire conductor 682 is individually insulated with an electrical insulation material 684 disposed around and surrounding an outer surface of the wire conductor 682. The wire conductors 682 are formed from a high electrical conductivity material such as copper or silver, for example. Moreover, the insulation material 684 is selected to withstand high breakdown voltages. In this embodiment, the wire conductors 682 are also woven, twisted, bifilar, or braided together in order to form the wire assembly of the gradient coil interconnect 650. Specifically, the plurality of individual wire conductors 682 are bent or formed such that the shape of each wire conductor forms a spiral. Moreover, individual spirals are interwoven, or weaved, with each other to form the wire assembly of the gradient coil interconnect 650. Gradient coil interconnect 650 also includes a reinforcement material 686 that is configured to maintain the wire conductors 682 in a relatively fixed position with respect to each other. The reinforcement material 686 is preferably a non-metal material with rigid properties and may be sized and shaped as desired or needed, such as to have different shaped cross-sections, for example, based on the connection requirements.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A gradient coil apparatus configured for a magnetic resonance imaging (MRI) system, the gradient coil apparatus comprising:
   an inner gradient coil assembly comprising at least one inner gradient coil;
   an outer gradient coil assembly comprising at least one outer gradient coil; and
   at least one gradient coil interconnect, each gradient coil interconnect coupled to an inner gradient coil and an outer gradient coil, with the at least one gradient coil interconnect(s) containing:
      a wire assembly having a plurality of conductors comprising a reinforced portion and an unreinforced portion and having a first end of the plurality of conductors electrically coupled to the outer gradient coil assembly and a second end of the plurality of conductors electrically coupled to the inner gradient coil assembly.

2. A gradient coil apparatus according to claim 1, wherein each conductor of the plurality of conductors includes an insulating material disposed around an outer surface of the conductor.

3. A gradient coil apparatus according to claim 2, wherein each of the plurality of conductors has a circular cross section.

4. A gradient coil apparatus according to claim 1, wherein the plurality of conductors are at least one of bifilar, braided together, twisted, or woven.

5. A gradient coil apparatus according to claim 1, wherein the at least one inner gradient coil is an inner X-gradient coil and the at least one outer gradient coil is an outer X-gradient coil.

6. A gradient coil apparatus according to claim 1, wherein the at least one inner gradient coil is an inner Y-gradient coil and the at least one outer gradient coil is an outer Y-gradient coil.

7. A gradient coil apparatus according to claim 1, wherein the at least one inner gradient coil is an inner Z-gradient coil and the at least one outer gradient coil is an outer Z-gradient coil.

8. A gradient coil apparatus according to claim 1, wherein the inner gradient coil assembly comprises an inner X-gradient coil, an inner Y-gradient coil and an inner Z-gradient coil, the outer gradient coil assembly comprises an outer X-gradient coil, an outer Y-gradient coil and an outer Z-gradient coil and the gradient coil apparatus further comprises a first gradient coil interconnect electrically coupled to the inner X-gradient coil and the outer X-gradient coil, a second gradient coil interconnect electrically coupled to the inner Y-gradient coil and the outer Y-gradient coil and a third gradient coil interconnect coupled to the inner Z-gradient coil and the outer Z-gradient coil.

9. The gradient coil apparatus according to claim 1, wherein the reinforced portion comprises a reinforcement material disposed around the wire assembly in order to provide stiffness.

10. The gradient coil apparatus according to claim 1, wherein the unreinforced portion provides flexibility permitting strain and/or stress relief.

11. A gradient coil interconnect configured for providing electrical connections between an outer gradient coil and a corresponding inner gradient coil in a magnetic resonance imaging (MRI) system, the gradient coil interconnect containing:
   a wire assembly having a plurality of conductors electrically coupled between the inner and outer gradient coils; and
   a reinforced portion comprising a reinforcement material disposed around a portion of the wire assembly, wherein the length of the reinforced portion is less than the length of the wire assembly of the gradient coil interconnect.

12. A gradient coil interconnect according to claim 11, wherein each conductor of the plurality of conductors includes an insulating material disposed around an outer surface of the conductor.

13. A gradient coil interconnect according to claim 12, wherein each of the plurality of conductors has a circular cross section.

14. A gradient coil interconnect according to claim 11, wherein each of the plurality of conductors is composed of copper.

15. A gradient coil interconnect according to claim 11, wherein the plurality of conductors are at least one of bifilar, braided together, twisted, or woven.

16. A gradient coil interconnect according to claim 11, wherein the reinforcement material is a non-metal material.

17. The gradient coil interconnect according to claim 11, wherein the reinforced portion also provides stiffness to the wire assembly.

\* \* \* \* \*